( 12 ) United States Patent
Tai et al.

(10) Patent No.: US 9,143,153 B1
(45) Date of Patent: Sep. 22, 2015

(54) ANALOG TO DIGITAL CONVERSION DEVICE AND ANALOG TO DIGITAL CONVERSION METHOD

(71) Applicant: National Taiwan University, Taipei (TW)

(72) Inventors: Hung-Yen Tai, Taipei (TW); Yao-Sheng Hu, Taipei (TW); Hsin-Shu Chen, Taipei (TW)

(73) Assignee: NATIONAL TAIWAN UNIVERSITY, Taipei (TW)

( * ) Notice: Subject to any disclaimer, the term of this patent is extended or adjusted under 35 U.S.C. 154(b) by 0 days.

(21) Appl. No.: 14/498,759

(22) Filed: Sep. 26, 2014

(30) Foreign Application Priority Data

Aug. 11, 2014 (TW) .............................. 103127529 A

(51) Int. Cl.
*H03M 1/12* (2006.01)
*H03M 1/44* (2006.01)
*H03M 1/20* (2006.01)

(52) U.S. Cl.
CPC ................ *H03M 1/442* (2013.01); *H03M 1/20* (2013.01)

(58) Field of Classification Search
CPC ......... H03M 1/145; H03M 1/56; H03M 1/42; H03M 1/442; H03M 1/20; H03M 1/466; H03M 1/12; H03M 1/00; H03M 2201/16

USPC .................................................. 341/155, 156
See application file for complete search history.

(56) References Cited

PUBLICATIONS

Hung-Yen Tai, et al., "A0.85tJ/conversion-step 10b 200kS/s Subranging SAR ADC in 40nm CMOS", IEEE International Solid-State Circuits Conference, ISSCC 2014/Session 11/Data Converter Techniques/ 11.2, pp. 196-197 (Feb. 11, 2014).

*Primary Examiner* — Jean B Jeanglaude
(74) *Attorney, Agent, or Firm* — Muncy, Geissler, Olds & Lowe, P.C.

(57) ABSTRACT

An analog to digital conversion method includes: receiving an analog input signal by using a coarse analog to digital converter (ADC) and a fine ADC; generating a first digital signal by using the coarse ADC according to the analog input signal; comparing each bit of the second-most significant bit to the least significant bit of the first digital signal with the most significant bit of the first digital signal to generate a comparison result; according to the comparison result, controlling switching of a high bit capacitor array of the fine ADC to convert the analog input signal received by the fine ADC into a residual signal; generating a second digital signal according to the residual signal by sequentially switching a low bit capacitor array of the fine ADC by using the fine ADC; and combining the first digital signal and the second digital signal to generate a digital output signal.

16 Claims, 5 Drawing Sheets

| (B3,B2,B1) | $W_{M2}$ | $W_{M1}$ |
|---|---|---|
| (1, 1, 1) | ON | ON |
| (1, 1, 0) | ON | OFF |
| (1, 0, 1) | OFF | ON |
| (1, 0, 0) | OFF | OFF |
| (0, 1, 1) | OFF | OFF |
| (0, 1, 0) | OFF | ON |
| (0, 0, 1) | ON | OFF |
| (0, 0, 0) | ON | ON |

FIG. 8

ANALOG TO DIGITAL CONVERSION DEVICE AND ANALOG TO DIGITAL CONVERSION METHOD

CROSS-REFERENCES TO RELATED APPLICATIONS

This non-provisional application claims priority under 35 U.S.C. §119(a) on Patent Application No. 103127529 filed in Taiwan, R.O.C. on 2014 Aug. 11, the entire contents of which are hereby incorporated by reference.

BACKGROUND

1. Technical Field

The present invention provides an analog to digital conversion device and an analog to digital conversion method, and more particular to an analog to digital conversion device and an analog to digital conversion method using a subranging concept.

2. Related Art

In recent years, with the development of science and technology, portable electronic products develop vigorously. In order to provide long operating time, relevant researches on design of integrated circuits with low power consumption have attracted much attention. In the structure of an electronic product, an analog to digital converter (ADC) is one of the important circuits, and therefore, the power consumption of the ADC attracts much attention.

There are many types of ADC with different structures, for example, a flash ADC, a pipeline ADC, a successive approximation register (SAR) ADC, and a two-step ADC, each of which has appropriate application range.

Among various ADC structures, a SAR ADC merely uses one comparator in conversion, has a simple structure, and needs a relatively small number of elements, so that the SAR ADC has a power saving advantage and has found wide application in portable electronic products.

With the development of science and technology, functions of electronic products become increasingly complex and strong, and therefore the resolution requirements of the ADC are increased accordingly. However, the higher the resolution requirements are, the larger the number of bits needed in the SAR ADC is needed, resulting in a larger capacitor array. Because the power consumption of switching of the capacitor array occupies the largest proportion in the power consumption of the SAR ADC, for the SAR ADC, the improvement of a resolution results in an increase of the overall power consumption.

Therefore, how to provide a SAR ADC with a high resolution and low overall power consumption to prolong the operating time of a portable electronic product becomes an important topic of concern for persons skilled in the art.

SUMMARY

In an embodiment, an analog to digital conversion method includes: receiving an analog input signal by using a coarse ADC and a fine ADC; generating a first digital signal by using the coarse ADC according to the analog input signal; comparing each bit of the second-most significant bit of the first digital signal to the least significant bit of the first digital signal with the most significant bit of the first digital signal to generate a comparison result; according to the comparison result, directly controlling switching of a high bit capacitor array of the fine ADC, so as to convert the analog input signal received by the fine ADC into a residual signal; generating a second digital signal according to the residual signal by sequentially switching a low bit capacitor array of the fine ADC by using the fine ADC; and combining the first digital signal and the second digital signal to generate a digital output signal.

In an embodiment, an analog to digital conversion device includes a coarse ADC, a control module, a fine ADC, and an output unit. The coarse ADC is used for receiving an analog input signal and generating a first digital signal according to the analog input signal. The control module is used for comparing each bit of the second-most significant bit of the first digital signal to the least significant bit of the first digital signal with the most significant bit of the first digital signal, so as to correspondingly generate a comparison result. The fine ADC includes a high bit capacitor array, a low bit capacitor array, and a latching comparator circuit. The high bit capacitor array is used for switching according to the comparison result to convert the analog input signal into a residual signal. The low bit capacitor array and the latching comparator circuit are used for generating a second digital signal according to the residual signal. The output unit is used for combining the first digital signal and the second digital signal to generate a digital output signal.

In view of the above, according to the analog to digital conversion method and the analog to digital conversion device of the present invention, a coarse ADC with low power consumption and a low resolution is used to help a fine ADC with a high resolution to obtain a high bit portion of a digital output signal through conversion, so that the fine ADC merely needs to obtain a low bit portion of the digital output signal through conversion, so as to reduce the power consumption of the fine ADC. Moreover, in combination with a detect-and-skip algorithm, each bit of the second-most significant bit to the least significant bit of a first digital signal obtained through conversion by the coarse ADC and the most significant bit of the first digital signal are compared to control switching of a high bit capacitor array in the fine ADC, so as to skip unnecessary switching actions, thereby reducing the power consumption of switching of the fine ADC. In addition, in combination with an aligned switching technique, a corresponding switch module in the high bit capacitor array of the fine ADC is switched at the same time by means of the first digital signal, so that the high bit capacitor array can be switched in one step, thereby significantly reducing the overall power consumption of the analog to digital conversion device.

The specific features and advantages of the present invention are described below in great detail through the following embodiments, the content of the detailed description is sufficient for those skilled in the art to understand the technical content of the present invention and to implement the present invention there accordingly. Based upon the content of the specification, the claims, and the accompanying drawings, those skilled in the art can easily understand the relevant objectives and advantages of the present invention.

BRIEF DESCRIPTION OF THE DRAWINGS

The present invention will become more fully understood from the detailed description given herein below for illustration only, and therefore are not limitative of the present invention, and wherein:

FIG. 8 is a schematic diagram of switching of each bit in a high bit array by a first digital signal.

DETAILED DESCRIPTION

Figure 1:
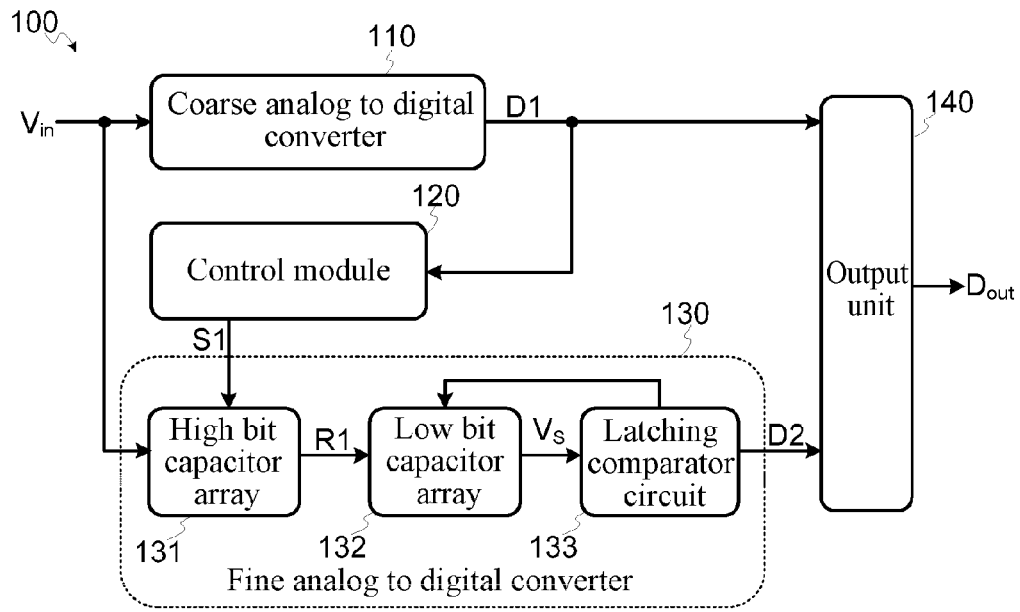
FIG. 1 is a schematic diagram of an analog to digital conversion device according to an embodiment of the present invention.
Figure 2:
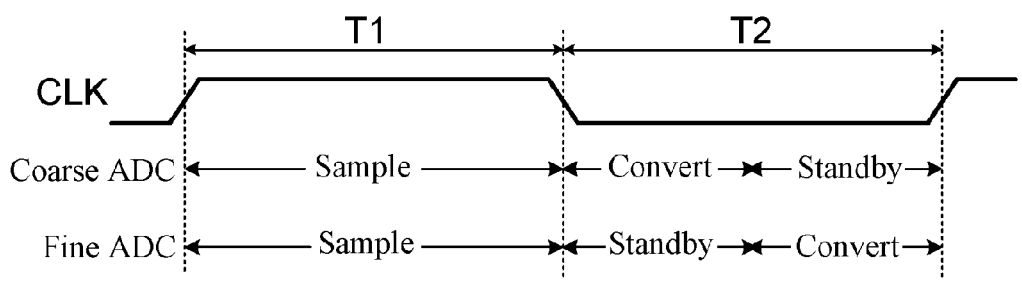
FIG. 2 is a schematic diagram of an action sequence of a coarse ADC and a fine ADC in a clock cycle when an analog to digital conversion device according to an embodiment of the present invention is implemented.
Figure 3:
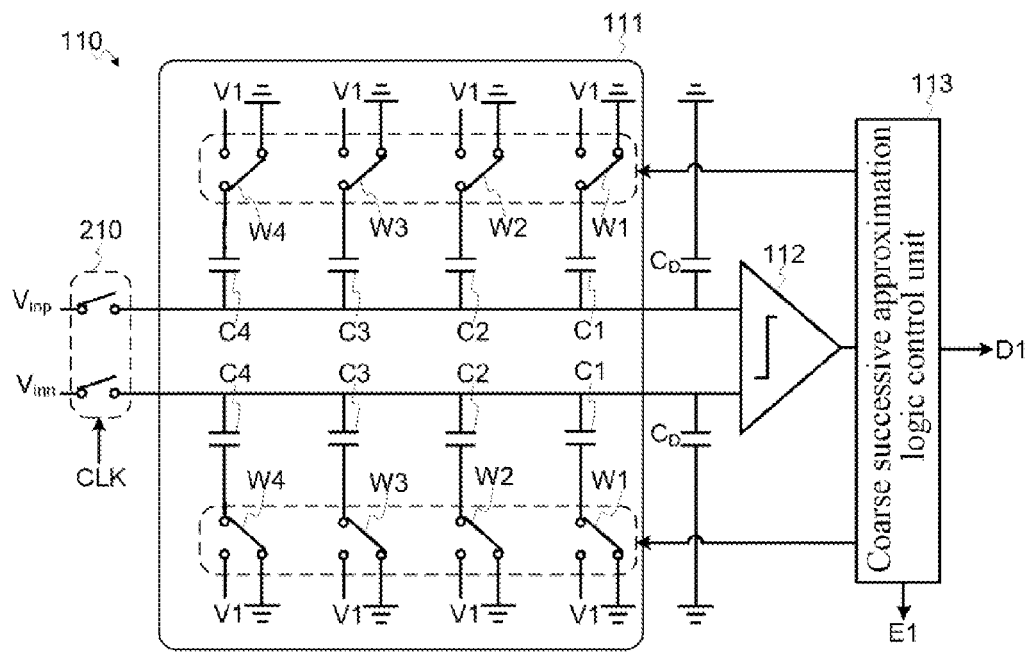
FIG. 3 is a schematic diagram of an embodiment of a coarse ADC in FIG. 1.

FIG. 1 is a schematic diagram of an analog to digital conversion device according to an embodiment of the present invention. Referring to FIG. 1, an analog to digital conversion device 100 is mainly used for converting an analog input signal $V_{in}$ into a digital output signal $D_{out}$. The analog to digital conversion device 100 includes a coarse ADC 110, a control module 120, a fine ADC 130, and an output unit 140. The fine ADC 130 includes a high bit capacitor array 131, a low bit capacitor array 132, and a latching comparator circuit 133, wherein the high bit capacitor array 131, the low bit capacitor array 132, and the latching comparator circuit 133 are sequentially connected in series between a front end circuit (not shown) and the output unit 140.

An input terminal of the coarse ADC 110 is electrically connected to the front end circuit (not shown), and receives the analog input signal $V_{in}$ from the front end circuit. An input terminal of the control module 120 is electrically connected to an output terminal of the coarse ADC 110, and receives a first digital signal D1 from the coarse ADC 110.

An input terminal of the high bit capacitor array 131 of the fine ADC 130 is electrically connected to the front end circuit (not shown), and receives the analog input signal $V_{in}$ from the front end circuit. A control terminal of the high bit capacitor array 131 of the fine ADC 130 is electrically connected to an output terminal of the control module 120, and receives a comparison result S1 from the control module 120. Herein, the high bit capacitor array 131 is switched according to the comparison result S1, so as to convert the analog input signal $V_{in}$ into a residual signal R1. An input terminal of the low bit capacitor array 132 of the fine ADC 130 is electrically connected to an output terminal of the high bit capacitor array 131, and receives the residual signal R1 from the high bit capacitor array 131. An input terminal of the latching comparator circuit 133 of the fine ADC 130 is electrically connected to an output terminal of the low bit capacitor array 132, and receives a voltage signal $V_S$ from the low bit capacitor array 132. A control terminal of the low bit capacitor array 132 of the fine ADC 130 is electrically connected to an output terminal of the latching comparator circuit 133, and receives a control signal from the latching comparator circuit 133. The latching comparator circuit 133 compares the received voltage signal $V_S$ to generate each bit of a second digital signal D2 and a control signal. The low bit capacitor array 132 is switched according to the control signal, so as to convert the residual signal R1 into the voltage signal $V_S$.

Two input terminals of the output unit 140 are respectively electrically connected to the coarse ADC 110 and fine ADC 130, and receive the first digital signal D1 from the coarse ADC 110 and the second digital signal D2 from the fine ADC 130.

The coarse ADC 110 converts the analog input signal $V_{in}$ into the first digital signal D1 by using an analog to digital conversion technology. The control module 120 detects whether there is a difference between each bit of the second-most significant bit to the least significant bit of the first digital signal D1 with the most significant bit of the first digital signal D1 to correspondingly generate at least one comparison result S1. The high bit capacitor array 131 of the fine ADC 130 is switched according to the at least one comparison result S1, so as to convert the analog input signal $V_{in}$ into the residual signal R1. After the high bit capacitor array 131 is switched, the low bit capacitor array 132 and the latching comparator circuit 133 of the fine ADC 130 convert the residual signal R1 into the second digital signal D2 by using the analog to digital conversion technology. Finally, the output unit 140 combines the first digital signal D1 and the second digital signal D2 to generate the digital output signal $D_{out}$.

Herein, the digital output signal $D_{out}$ is formed by connecting the first digital signal D1 and the second digital signal D2 in series, where the first digital signal D1 is a high bit portion of the digital output signal $D_{out}$, and the second digital signal D2 is a low bit portion of the digital output signal $D_{out}$.

In some embodiments, the coarse ADC 110 and the fine ADC 130 may be SAR ADCs that perform analog to digital conversion by using a SAR technology. In the fine ADC 130, the latching comparator circuit 133 mainly includes a fine comparator 1331 and a fine successive approximation logic control unit 1332, where the fine comparator 1331 is electrically coupled between the output terminal of the low bit capacitor array 132 and the fine successive approximation logic control unit 1332, and the fine successive approximation logic control unit 1332 is coupled between the fine comparator 1331 and the output unit 140 and is coupled to the control terminal of the low bit capacitor array 132. The coarse ADC 110 also includes a coarse capacitor array 111, a coarse comparator 112, and a coarse successive approximation logic control unit 113, where the coarse capacitor array 111, the coarse comparator 112, and the coarse successive approximation logic control unit 113 are sequentially connected in series between the front end circuit (not shown) and the output unit 140, and the coarse successive approximation logic control unit 113 is further coupled to the input terminal of the control module 120 and the control terminal of the coarse capacitor array 111. In other words, an analog to digital conversion operation of the low bit capacitor array 132 and the latching comparator circuit 133 of the fine ADC 130 and an analog to digital conversion operation of the coarse ADC 110 are substantially equivalent to that of a common SAR ADC, and are no longer repeated herein.

Herein, the coarse ADC 110 obtains the high bit portion of the digital output signal $D_{out}$ through conversion by using a successive approximation analog to digital conversion technology, and detects whether there is a difference between each bit of the second-most significant bit to the least significant bit of the first digital signal D1 with the most significant bit of the first digital signal D1 in combination with a detect-and-skip algorithm, so as to skip unnecessary switching actions of the high bit capacitor array 131 of the fine ADC 130, so that the fine ADC 130 merely needs to obtain the low bit portion of the digital output signal $D_{out}$ through conversion, so as to reduce the power consumption of switching of the fine ADC 130. Since the power consumption of switching of the coarse ADC 110 is much less than the power consumption of switching of the high bit of the fine ADC 130, the overall power consumption of the analog to digital conversion device 100 is significantly reduced.

Refer to FIG. 2 to FIG. 5. Herein, a coarse ADC 110 of 5 bits and a fine ADC 130 of 10 bits are taken as example for illustration, but the present invention is not limited thereto. In terms of differential, the coarse ADC 110 includes a pair of input switches 210, a coarse capacitor array 111, a coarse comparator 112, and a coarse successive approximation logic control unit 113, where the input switches 210, the coarse capacitor array 111, the coarse comparator 112, and the coarse successive approximation logic control unit 113 are sequentially connected in series. The coarse capacitor array 111 includes a pair of capacitor switch arrays, and each capacitor switch array includes four capacitive elements C4 to C1 and four switch modules W4 to W1 that correspond to each other one by one. As for positive terminals of the capacitor switch array, one end of each of the capacitive elements C4 to C1 is coupled to a first input terminal of the coarse comparator 112 and is coupled to an analog input signal $V_{inp}$ through the input switch 210, and the other end of each of the capacitive elements C4 to C1 is coupled to a first terminal of a corresponding one of the switch modules W4 to W1. Similarly, as for negative terminals of the capacitor switch array, one end of each of the capacitive elements C4 to C1 is coupled to a second input terminal of the coarse comparator 112 and is coupled to an analog input signal $V_{inn}$ through the input switch 210, and the other end of each of the capacitive elements C4 to C1 is coupled to a first terminal of a corresponding one of the switch modules W4 to W1. Herein, the coarse successive approximation logic control unit 113 is further coupled to a control terminal of each of the switch modules W4 to W1. The coarse successive approximation logic control unit 113 outputs a switching control signal to each of the switch modules W4 to W1, so as to control a second terminal of each of the switch modules W4 to W1 to be coupled to a first voltage V1 or the ground. Basically, in an initial state, the second terminal of each of the switch modules W4 to W1 is coupled to the ground. In some embodiments, a ground connection may be a common-mode voltage. In a first time slot T1 of a clock signal CLK, the input switches 210 of the coarse ADC 110 and the fine ADC 130 are turned on under the control of the clock signal CLK, so that the coarse capacitor array 111 of the coarse ADC 110 can receive the analog input signals $V_{inp}$ and $V_{inn}$ through the input switches 210 and sample the analog input signals $V_{inp}$ and $V_{inn}$, and the high bit capacitor array 131 and the low bit capacitor array 132 of the fine ADC 130 can receive the analog input signals $V_{inp}$ and $V_{inn}$ through the input switches 210 and sample the analog input signals $V_{inp}$ and $V_{inn}$. Therefore, in the first time slot T1 of the clock signal CLK, the coarse ADC 110 and the fine ADC 130 both enter a sampling mode in an analog to digital conversion procedure.

In a second time slot T2 of the clock signal CLK, the fine ADC 130 first enters a standby mode, and the coarse ADC 110 first enters a conversion mode and performs conversion, by using the successive approximation analog to digital conversion technology, on the analog input signals $V_{inp}$ and $V_{inn}$ to generate the first digital signal D1.

Herein, the coarse ADC 110 sequentially switches, by using the coarse successive approximation logic control unit 113 by adopting the successive approximation analog to digital conversion technology, the switch modules W4 to W1 of the coarse capacitor array 111 to control the coarse comparator 112 to be electrically connected to the first voltage V1 through corresponding capacitive elements C4 to C1, so as to generate the first digital signal D1.

In some embodiments, the capacitive elements C4 to C1 of each bit in coarse capacitor array 111 may have a magnification relationship with each other. For example, when the capacitive elements C4 to C1 of each bit is of binary weights, the capacitance value of the capacitive element C4 may equal twice the capacitance value of the capacitive element C3, the capacitance value of the capacitive element C3 may equal twice the capacitance value of the capacitive element C2, and so on. In addition, the coarse capacitor array 111 may be implemented by a split-capacitor array structure, so as to reduce the power consumption of switching of the coarse capacitor array 111, but the present invention is not limited thereto.

Herein, the specific conversion operation of the successive approximation analog to digital conversion technology is well known in the art, and is no longer repeated herein.

Figure 4:
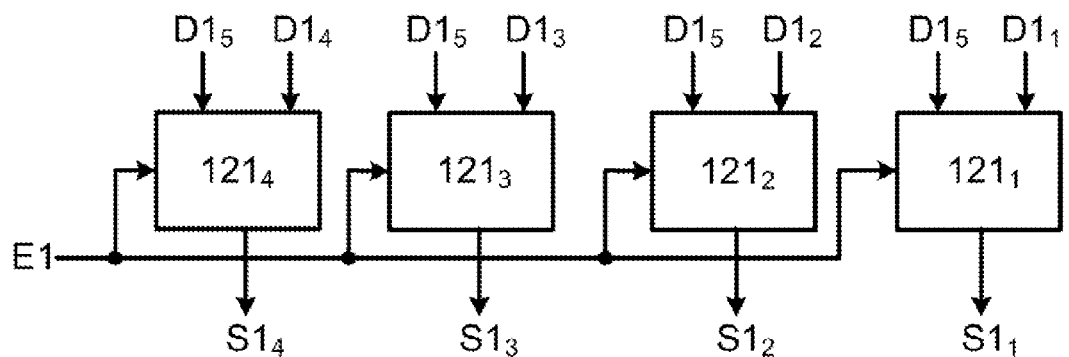
FIG. 4 is a schematic diagram of an embodiment of a control module in FIG. 1.
Figure 5:
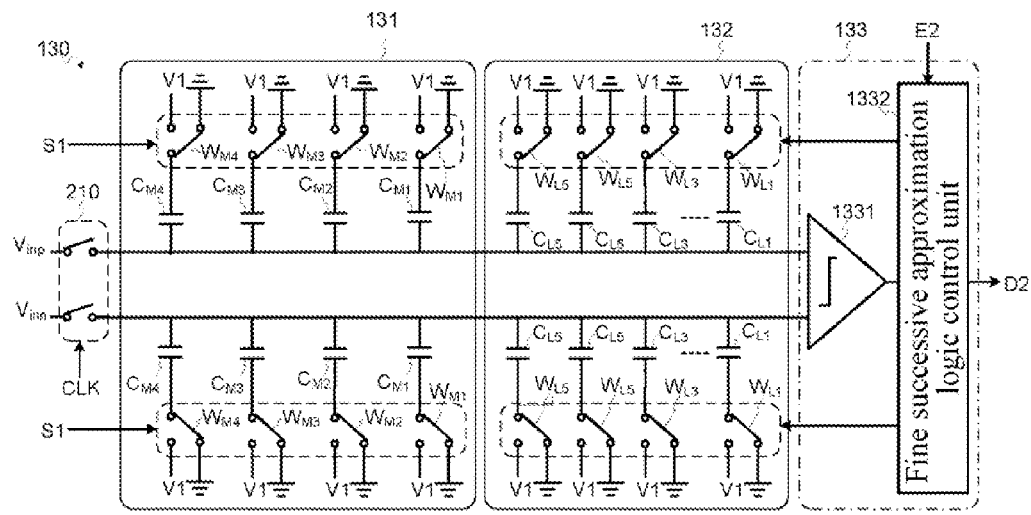
FIG. 5 is a schematic diagram of an embodiment of a fine ADC in FIG. 1.

Refer to FIG. 4. After the coarse ADC 110 generates the first digital signal D1, the control module 120 begins to detect whether there is a difference between each bit of the second-most significant bit $D1_4$ to the least significant bit $D1_1$ of the first digital signal D1 with the most significant bit $D1_5$ of the first digital signal D1, and correspondingly generates comparison results $S1_4$ to $S1_1$ and send the comparison results $S1_4$ to $S1_1$ to the high bit capacitor array 131 in the fine ADC 130.

Herein, the latching comparator circuit 133 includes a fine comparator 1331 and a fine successive approximation logic control unit 1332. In terms of differential, the high bit capacitor array 131 includes a pair of capacitor switch arrays, and each capacitor switch array includes four capacitive elements $C_{M4}$ to $C_{M1}$ and four switch modules $W_{M4}$ to $W_{M1}$ that correspond to each other one by one. As for positive terminals of the capacitor switch array, one end of each of the capacitive elements $C_{M4}$ to $C_{M1}$ is coupled to a first input terminal of the fine comparator 1331 and is coupled to an analog input signal through the input switch 210, and the other end of each of the capacitive elements $C_{M4}$ to $C_{M1}$ is coupled to a first terminal of a corresponding one of the switch modules $W_{M4}$ to $W_{M1}$. Similarly, as for negative terminals of the capacitor switch array, one end of each of the capacitive elements $C_{M4}$ to $C_{M1}$ is coupled to a second input terminal of the fine comparator 1331 and is coupled to an analog input signal $V_{inn}$ through the input switch 210, and the other end of each of the capacitive elements $C_{M4}$ to $C_{M1}$ is coupled to a first terminal of a corresponding one of the switch modules $W_{M4}$ to $W_{M1}$. An output terminal of the fine comparator 1331 is coupled to the fine successive approximation logic control unit 1332. Herein, the control terminal of each of the switch modules $W_{M4}$ to $W_{M1}$ is coupled to the control module 120. The control module 120 outputs one by one comparison results $S1_4$ to $S1_1$ to the switch modules $W_{M4}$ to $W_{M1}$, so as to control a second terminal of each of the switch modules $W_{M4}$ to $W_{M1}$ to be coupled to a first voltage V1 or the ground. Basically, in an initial state, the second terminal of each of the switch modules $W_{M4}$ to $W_{M1}$ is coupled to the ground.

The control module 120 includes at least one of comparison unit $121_4$ to $121_1$. Herein, four comparison units $121_4$ to $121_1$ are taken as an example, but the present invention is not limited thereto. In other words, when the first digital signal D1 is of m bits, the control module 120 at least needs to provide m−1 comparison units $121_{m-1}$ to $121_1$, so as to compare each bit of the second-most significant bit $D1_{m-1}$ to the least significant bit $D1_1$ of the first digital signal D1 and the most significant bit $D1_m$ of the first digital signal D1 to determine whether there is a difference, and generate m−1 comparison results $S1_{m-1}$ to $S1_1$. Therefore, the control module 120 may use the m−1 comparison results $S1_{m-1}$ to $S1_1$ to control the switching of the high bit capacitor array 131 of m−1 bits.

For the convenience of description, in the following, 5 bits of the first digital signal D1 from the least significant bit to the most significant bit are respectively referred to as a first bit $D1_1$, a second bit $D1_2$, a third bit $D1_3$, a fourth bit $D1_4$, and a fifth bit $D1_5$. The comparison unit $121_4$ receives and compares the fourth bit $D1_4$ and the fifth bit $D1_5$ of the first digital signal D1 to generate a comparison result $S1_4$, the comparison unit $121_3$ receives and compares the third bit $D1_3$ and the fifth bit $D1_5$ of the first digital signal D1 to generate a comparison result $S1_3$, the comparison unit $121_2$ receives and compares the second bit $D1_2$ and the fifth bit $D1_5$ of the first digital signal D1 to generate a comparison result $S1_2$, and the comparison unit $121_1$ receives and compares the first bit $D1_1$ and the fifth bit $D1_5$ of the first digital signal D1 to generate a comparison result $S1_1$.

An output terminal of the comparison unit $121_4$ is coupled to the control terminal of the switch module $W_{M4}$, so that the switch module $W_{M4}$ is switched according to the comparison result $S1_4$. An output terminal of the comparison unit $121_3$ is coupled to the control terminal of the switch module $W_{M3}$, so that the switch module $W_{M3}$ is switched according to the comparison result $S1_3$. An output terminal of the comparison unit $121_2$ is coupled to the control terminal of the switch module $W_{M2}$, so that the switch module $W_{M2}$ is switched according to the comparison result $S1_2$. An output terminal of the comparison unit $121_1$ is coupled to the control terminal of the switch module $W_{M1}$, so that the switch module $W_{M1}$ is switched according to the comparison result $S1_1$.

In some embodiments, the comparison units $121_4$ to $121_1$ may be implemented by an exclusive OR (XOR) gate. First terminals of all the XOR gates are electrically connected to a second-most significant bit output terminal to a least significant bit output terminal of the coarse ADC 110, respectively, and receive one of the second-most significant bit $D1_{m-1}$ to the least significant bit $D1_1$ of the first digital signal D1 from the coarse ADC 110. Second terminals of all XOR gates are electrically connected to a most significant bit output terminal of the coarse ADC 110, and receive the most significant bit $D1_m$ of the first digital signal D1 from the coarse ADC 110. Output terminals of all XOR gates are electrically connected to corresponding bits of the high bit capacitor array 131 of the fine ADC 130, respectively, and output the comparison results $S1_{m-1}$ to $S1_1$.

In some embodiments, when the two bits compared by the control module 120 are same, the comparison result correspondingly generated by the control module 120 is a first value, and the control module 120 outputs the comparison result of the first value to control a switch module corresponding to this comparison result in the high bit capacitor array 131 of the fine ADC 130 to be switched from being coupled to the ground into being coupled to the first voltage V1, so that the fine comparator 1331 in the latching comparator circuit 133 is electrically connected to the first voltage V1 through a capacitive element corresponding to this comparison result. In contrast, when the two bits compared by the control module 120 are different, the comparison result correspondingly generated by the control module 120 is a second value, and the control module 120 outputs the comparison result of the second value to skip switching a switch module corresponding to this comparison result in the high bit capacitor array 131 of the fine ADC 130, so that the fine comparator 1331 in the latching comparator circuit 133 is maintained to be electrically connected to the ground through a capacitive element corresponding to this comparison result. By taking the above comparison unit $121_4$ as an example, when the comparison unit $121_4$ determines that the fourth bit $D1_4$ and the fifth bit $D1_5$ of the first digital signal D1 are same, the comparison unit $121_4$ outputs the comparison result $S1_4$ of the first value to the control terminal of the switch module $W_{M4}$. In this case, the switch module $W_{M4}$ responds to the comparison result $S1_4$ of the first value and is switched from being coupled to the ground into being coupled to the first voltage V1. In contrast, when the comparison unit $121_4$ determines that the fourth bit $D1_4$ and the fifth bit $D1_5$ of the first digital signal D1 are different, the comparison unit $121_4$ outputs the comparison result $S1_4$ of a second value to the control terminal of the switch module $W_{M4}$. In this case, the switch module $W_{M4}$ responds to the comparison result $S1_4$ of the second value and is maintained to be coupled to the ground. Operations of other comparison units $121_3$ to $121_1$ can be obtained similarly, so that the switch modules $W_{M4}$ to $W_{M1}$ of the high bit capacitor array 131 are directly operated according to the first digital signal D1.

In some embodiments, the potential of the first voltage V1 may be a reference potential or a common-mode potential between the analog input signals $V_{inp}$ and $V_{inn}$.

After the high bit capacitor array 131 of the fine ADC 130 is switched according to the corresponding comparison results $S1_4$ to $S1_1$, the fine ADC 130 begins to perform subsequent analog to digital conversion actions according to the residual signal R1 obtained through conversion by the high bit capacitor array 131, so as to generate a low bit portion (that is, the second digital signal D2) of the digital output signal $D_{out}$, and in this case, the coarse ADC 110 enters a standby mode.

Herein, the fine ADC 130 performs conversion by using the residual signal R1 generated after conversion by using the low bit capacitor array 132 and the latching comparator circuit 133 and according to the high bit capacitor array 131, so as to generate the second digital signal D2.

In some embodiments, the control module 120 generates a trigger signal E2 after the high bit capacitor array 131 of the fine ADC 130 has been switched, and sends the trigger signal E2 to the latching comparator circuit 133 of the fine ADC 130 to trigger the latching comparator circuit 133 and the low bit capacitor array 132 to start to perform conversion according to the residual signal R1, so as to generate a second digital signal D2.

The fine ADC 130 sequentially switches the switch modules $W_{L5}$ to $W_{L1}$ of the low bit capacitor array 132 by using the fine successive approximation logic control unit 1332 by adopting the successive approximation analog to digital conversion technology, so as to control the capacitive elements $C_{L5}$ to $C_{L1}$ to be electrically connected to the first voltage V1 or the ground, so as to perform conversion on the residual signal R1 to generate the second digital signal D2. The operation of performing conversion on the residual signal R1 by adopting the successive approximation analog to digital conversion technology to generate the second digital signal D2 is well known in the art, and therefore is no longer repeated herein.

Figure 6A:
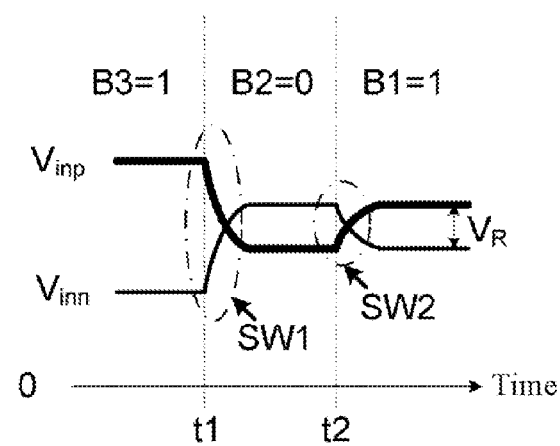
FIG. 6A is a schematic diagram showing that a bit capacitor array of a conventional ADC is switched by adopting a high bit portion of a digital output signal.
Figure 6B:
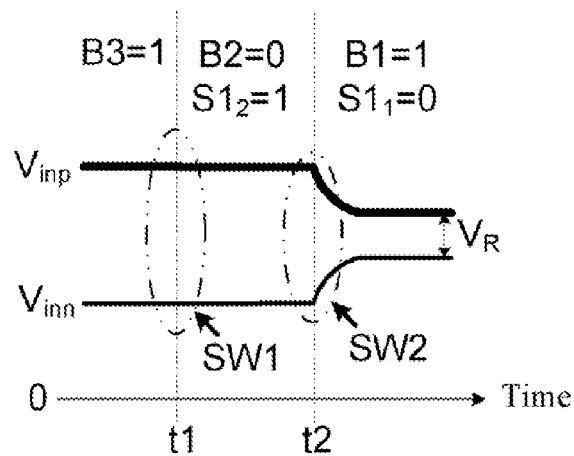
FIG. 6B is a schematic diagram showing that a high bit capacitor array of a fine ADC is switched by adopting a comparison result generated after conversion by using a control module.

FIG. 6A is a schematic diagram showing that a bit capacitor array of a conventional ADC is switched by adopting a high bit portion of a digital output signal. FIG. 6B is a schematic diagram showing that a high bit capacitor array of a fine ADC is switched by adopting a comparison result generated after conversion by using a control module. In the following, the situation that a high bit portion of a digital output signal $D_{out}$ includes 3 bits, namely, B3, B2, and B1, is taken as an example for illustration.

Referring to FIG. 6A, in a conventional switching manner, after the bit capacitor array of an ADC performs first-time switching SW1 according to the most significant bit B3 at time t1, the voltage of an analog input signal $V_{inp}$ sampled by the bit capacitor array is reduced after the time t1 (the voltage of an analog input signal $V_{inn}$ is raised), and after the bit capacitor array performs second-time switching SW2 according to the second-most significant bit B2 at time t2, the voltage of an analog input signal $V_{inp}$ sampled by the bit capacitor array is raised after the time t2 (the voltage of an analog input signal $V_{inn}$ is reduced). Herein, it can be known from first reducing and then raising the voltage of the analog input signal $V_{inp}$ that the actual voltage has an adjustment tendency of reducing; however, since the voltage is excessively reduced at the first-time switching SW1 and needs to be raised for some degree at the second-time switching SW2, switching is performed two times in total. Therefore, the first-time switching SW1 is actually unnecessary switching.

Figure 7:
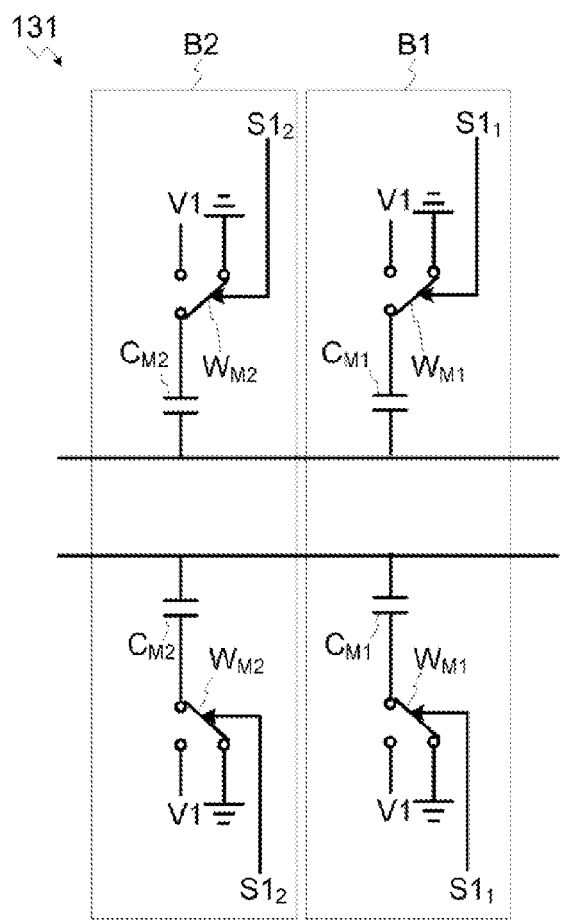
FIG. 7 is a schematic diagram of comparison results corresponding to bits of the high bit capacitor array.

Referring to FIG. 6B and FIG. 7, in the analog to digital conversion device 100 according to an embodiment of the present invention, at the time t1, the control module 120 does not switch the switch module $W_{M2}$ corresponding to the bit B2 in the high bit capacitor array 131 according to the comparison result $S1_2$, thereby skipping the first-time switching SW1 described above, and in this case, the voltages of the analog input signals $V_{inp}$ and $V_{inn}$ sampled by the high bit capacitor array 131 are not changed; at the time t2, the control module 120 switches the switch module $W_{M1}$ corresponding to the bit B1 in the high bit capacitor array 131 according to the comparison result $S1_1$; after switching control of both switch modules $W_{M1}$ and $W_{M2}$ in the high bit capacitor array 131 is completed, the voltages of the analog input signals $V_{inp}$ and $V_{inn}$ sampled by the high bit capacitor array 131 are changed, and the final voltage difference between the analog input signal $V_{inp}$ and the analog input signal $V_{inn}$ is a residual voltage $V_R$.

Herein, the residual voltage $V_R$ generated after the high bit capacitor array 131 is switched according to the comparison results $S1_2$ and $S1_1$ generated by the control module 120 and the residual voltage $V_R$ generated after the high bit capacitor array 131 is switched according to the first digital signal D1 output by the coarse ADC 110 are substantially same, and therefore, the fine ADC 130 can perform subsequent conversion according to the residual voltage $V_R$ to generate the low bit portion of the digital output signal $D_{out}$.

In other words, the analog to digital conversion device 100 according to an embodiment of the present invention first generates a high bit portion (that is, the first digital signal D1 of 3 bits) of the digital output signal $D_{out}$ and obtains 3 bits B3, B2, and B1 (1, 0, 1) by means of the coarse ADC 110 with low power consumption and a low resolution, and then determines that the most significant bit B3 and the second-most significant bit B2 are different values through comparison and generates the comparison result $S1_2$ (that is, $S1_2$=0) of the first value by means of the control module 120, so as to control the switch module $W_{M2}$ corresponding to the bit B2 in the high bit capacitor array 131 and perform no switching, thereby skipping an unnecessary switching action (that is, the first-time switching SW1 of the high bit capacitor array 131 of the fine ADC 130).

Referring to FIG. 7 and FIG. 8 in combination, the table shown in FIG. 8 illustrates switching operations of the switch modules $W_{M2}$ and $W_{M1}$ corresponding to the bits B2 and B1 in the high bit capacitor array 131 when the 3 bits B3, B2, and B1 of the first digital signal D1 are in different combinations.

"ON" represents that the switch module is switched, and "OFF" represents that the switch module is not switched (that is, skipped).

In another embodiment of the present invention, the analog to digital conversion device 100 skips an unnecessary switching of the high bit capacitor array 131 of the fine ADC 130 by adopting the detect-and-skip algorithm described above to reduce power consumption, and further adopts the aligned switching technique in combination to reduce the power consumption of switching.

Referring to FIG. 4 again, the application of the so-called aligned switching technique refers to that, after comparing each bit of the second-most significant bit to the least significant bit of the first digital signal D1 with the most significant bit of the first digital signal D1 and generating all the comparison results $S1_{m-1}$ to $S1_1$, at least one of the comparison units $121_{m-1}$ to $121_1$ of the control module 120 simultaneously outputs all the comparison results $S1_{m-1}$ to $S1_1$ to corresponding bits in the high bit capacitor array 131 of the fine ADC 130, so as to simultaneously control the operation of at least one of the switch modules $W_{M-1}$ to $W_{M1}$ in the high bit capacitor array 131.

Therefore, enable terminals of all the comparison units $121_{m-1}$ to $121_1$ in the control module 120 are all electrically connected to the coarse ADC 110, and receive a same enable signal E1 from the coarse ADC 110, so that all the comparison units $121_{m-1}$ to $121_1$ respond to the received enable signal E1 to simultaneously output all the comparison results $S1_{m-1}$ to $S1_1$, so as to simultaneously control switching of all the switch modules $W_{m-1}$ to $W_{M1}$ in the high bit capacitor array 131.

In some embodiments, the coarse ADC 110 further includes a matching capacitor $C_D$. One end of the matching capacitor $C_D$ is electrically connected to the coarse comparator 112 of the coarse ADC 110, and the other end of the matching capacitor $C_D$ is electrically connected to the ground. The matching capacitor $C_D$ is used for matching the gain of the coarse ADC 110 and the gain of the fine ADC 130.

In some embodiments, the coarse capacitor array 111 of the coarse ADC 110, and the high bit capacitor array 131 and the low bit capacitor array 132 of the fine ADC 130 are implemented by a split-capacitor array, so as to reduce the power consumption of switching of the capacitor arrays.

In view of the above, according to the analog to digital conversion method and the analog to digital conversion device of the present invention, a coarse ADC with low power consumption and a low resolution is used to help a fine ADC with a high resolution to obtain a high bit portion of a digital output signal through conversion, so that the fine ADC merely needs to obtain a low bit portion of the digital output signal through conversion, so as to reduce the power consumption of the fine ADC. Moreover, in combination with a detect-and-skip algorithm, each bit of the second-most significant bit to the least significant bit of a first digital signal obtained through conversion by the coarse ADC and the most significant bit of the first digital signal are compared to control switching of a high bit capacitor array in the fine ADC, so as to skip unnecessary switching actions, thereby reducing the power consumption of switching of the fine ADC. In addition, in combination with an aligned switching technique, a corresponding switch module in the high bit capacitor array of the fine ADC is switched at the same time by means of the first digital signal, so that the high bit capacitor array can be switched in one step, thereby significantly reducing the overall power consumption of the analog to digital conversion device.

While the disclosure has been described by the way of example and in terms of the preferred embodiments, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. An analog to digital conversion method, comprising:
receiving an analog input signal by using a coarse analog to digital converter (ADC) and a fine ADC;
generating a first digital signal according to the analog input signal by using the coarse ADC;
comparing each bit of the second-most significant bit of the first digital signal to the least significant bit of the first digital signal with the most significant bit of the first digital signal to generate at least one comparison result;
according to the at least one comparison result, directly controlling switching of a high bit capacitor array of the fine ADC, so as to convert the analog input signal received by the fine ADC into a residual signal;
generating a second digital signal according to the residual signal by sequentially switching a low bit capacitor array of the fine ADC by using the fine ADC; and
combining the first digital signal and the second digital signal to generate a digital output signal.

2. The analog to digital conversion method according to claim 1, wherein the at least one comparison result respectively controls an electrical connection between one end of at least one capacitive element in the high bit capacitor array and a first voltage.

3. The analog to digital conversion method according to claim 1, wherein when the values of the compared bits are same, the comparison result is a first value, and when the values of the compared bits are different, the comparison result is a second value.

4. The analog to digital conversion method according to claim 3, wherein when the comparison result is the first value, a comparator of the fine ADC is electrically connected to a first voltage through a capacitive element corresponding to the comparison result in the high bit capacitor array, and when the comparison result is the second value, the comparator of the fine ADC is not electrically connected to the first voltage through a capacitive element corresponding to the comparison result in the high bit capacitor array.

5. The analog to digital conversion method according to claim 1, wherein the at least one comparison result simultaneously controls an operation of at least one switch module in the high bit capacitor array.

6. The analog to digital conversion method according to claim 1, further comprising:
after the step of directly controlling, generating a trigger signal to the fine ADC, so as to enable the step of generating the second digital signal.

7. The analog to digital conversion method according to claim 1, wherein the digital output signal is formed by connecting the first digital signal and the second digital signal in series, the first digital signal is the high bit portion of the digital output signal, and the second digital signal is the low bit portion of the digital output signal.

8. The analog to digital conversion method according to claim 1, wherein the steps of generating the first digital signal and the second digital signal are performed by adopting a successive approximation analog to digital conversion technology.

9. An analog to digital conversion device, comprising:
a coarse analog to digital converter (ADC), for receiving an analog input signal and generating a first digital signal according to the analog input signal;
a control module, for comparing each bit of the second-most significant bit of the first digital signal to the least significant bit of the first digital signal with the most significant bit of the first digital signal, so as to correspondingly generate at least one comparison result;
a fine ADC, comprising a high bit capacitor array, a low bit capacitor array, and a latching comparator circuit, wherein the high bit capacitor array is used for switching according to the at least one comparison result to convert the analog input signal into a residual signal, and the low bit capacitor array and the latching comparator circuit are used for generating a second digital signal according to the residual signal; and
an output unit, for combining the first digital signal and the second digital signal to generate a digital output signal.

10. The analog to digital conversion device according to claim 9, wherein the coarse ADC and the fine ADC are a successive approximation register (SAR) ADC.

11. The analog to digital conversion device according to claim 9, wherein the high bit capacitor array comprises:
at least one capacitive element; and
at least one switch module, respectively corresponding to the at least one capacitive element and the at least one comparison result, each switch module for controlling an electrical connection between one end of the corresponding capacitive element and a first voltage according to the corresponding comparison result.

12. The analog to digital conversion device according to claim 11, wherein when the comparison result is that one of the second-most significant bit to the least significant bit of the first digital signal is the same as the most significant bit of the first digital signal, the switch module corresponding to the comparison result enables one end of the corresponding capacitive element to be electrically connected to the first voltage, and when the comparison result is that one of the second-most significant bit to the least significant bit of the first digital signal is different from the most significant bit of the first digital signal, the switch module corresponding to the comparison result does not enable one end of the corresponding capacitive element to be electrically connected to the first voltage.

13. The analog to digital conversion device according to claim 9, wherein the control module comprises:
at least one comparison unit, corresponding to the second-most significant bit to the least significant bit of the first digital signal one by one, and each comparison unit being used for comparing the corresponding bit with the most significant bit to output one of the at least one comparison result.

14. The analog to digital conversion device according to claim 13, wherein each comparison unit is an exclusive OR (XOR) gate, a first terminal of the XOR gate receives one of the second-most significant bit to the least significant bit of the first digital signal, a second terminal of the XOR gate receives the most significant bit of the first digital signal, and the XOR gate outputs the comparison result.

15. The analog to digital conversion device according to claim 14, wherein enable terminals of all the XOR gates receive a same enable signal.

16. The analog to digital conversion device according to claim 13, wherein the at least one comparison unit simultaneously outputs the at least one comparison result to the high bit capacitor array.

* * * * *